(12) United States Patent
Vallen

(10) Patent No.: US 10,757,828 B2
(45) Date of Patent: Aug. 25, 2020

(54) ATTACHMENT MEMBER AND SYSTEM

(71) Applicant: SIGNIFY HOLDING B.V., Eindhoven (NL)

(72) Inventor: Jacobus Wilhelmus Vallen, Oss (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/474,155

(22) PCT Filed: Dec. 22, 2017

(86) PCT No.: PCT/EP2017/084462
§ 371 (c)(1),
(2) Date: Jun. 27, 2019

(87) PCT Pub. No.: WO2018/127436
PCT Pub. Date: Jul. 12, 2018

(65) Prior Publication Data
US 2019/0350101 A1 Nov. 14, 2019

(30) Foreign Application Priority Data
Jan. 5, 2017 (EP) .................................. 17150363

(51) Int. Cl.
*H05K 5/00* (2006.01)
*H05K 7/12* (2006.01)
(Continued)

(52) U.S. Cl.
CPC .............. *H05K 7/12* (2013.01); *H05K 7/142* (2013.01); *F16B 5/065* (2013.01); *F16B 21/082* (2013.01)

(58) Field of Classification Search
USPC ................... 361/759, 801; 174/138 E, 138 G
See application file for complete search history.

(56) References Cited

U.S. PATENT DOCUMENTS

| 4,664,458 A * | 5/1987 | Worth ..................... H01R 12/52 174/138 D |
| 4,667,270 A * | 5/1987 | Yagi ....................... H01R 33/88 257/E25.028 |

(Continued)

FOREIGN PATENT DOCUMENTS

| EP | 1587349 A1 | 10/2005 |
| JP | 2003163431 A | 6/2003 |

*Primary Examiner* — Hung S. Bui
(74) *Attorney, Agent, or Firm* — Daniel J. Piotrowski

(57) ABSTRACT

The disclosure relates to an attachment member (1) for interconnection of a first board (51) and a second board (52), wherein at least one of the boards (51, 52) is a circuitry board, the attachment member (1) comprising a base portion (30) extending along a base plane (31), a first pair of legs (11, 12) extending from the base portion (30) in a first direction (D1) adapted to between them receive a portion of a first board (51), a second pair of legs (21, 22) extending from the base portion (30) in a second direction (D2) adapted to between them receive a portion of a second board (52), and a pair of abutment protrusions (41, 42), each abutment protrusion (41, 42) extending along said base plane (31) from the base portion (30) or from the first or second legs (11, 12, 21, 22) to form an abutment surface (41a, 42a) positioned outside respective leg of the second pair of legs (21, 22) and facing in the second direction (D2). The disclosure also relates to a system comprising an attachment member (1), a first board (51) and a second board (52).

13 Claims, 4 Drawing Sheets

(51) Int. Cl.
*H05K 7/14* (2006.01)
*F16B 5/06* (2006.01)
*F16B 21/08* (2006.01)

(56) References Cited

U.S. PATENT DOCUMENTS

| | | | |
|---|---|---|---|
| 4,728,753 A * | 3/1988 | Nakano | G09F 9/00 |
| | | | 174/138 G |
| 5,117,330 A | 5/1992 | Miazga | |
| 5,191,513 A | 3/1993 | Sugiura et al. | |
| 5,452,184 A | 9/1995 | Scholder et al. | |
| 6,785,146 B2 * | 8/2004 | Koike | H05K 7/1417 |
| | | | 361/740 |
| 7,444,792 B2 | 11/2008 | Matson | |
| 9,252,508 B2 * | 2/2016 | Endo | H01R 12/7082 |
| 2006/0078375 A1 | 4/2006 | Lee et al. | |
| 2013/0163216 A1 | 6/2013 | Sun | |

* cited by examiner

ATTACHMENT MEMBER AND SYSTEM

CROSS-REFERENCE TO PRIOR APPLICATIONS

This application is the U.S. National Phase application under 35 U.S.C. § 371 of International Application No. PCT/EP2017/084462, filed on Dec. 22, 2017, which claims the benefit of European Patent Application No. 17150363.4 filed on Jan. 5, 2017. These applications are hereby incorporated by reference herein.

FIELD OF THE INVENTION

The invention relates to an attachment member for interconnection of a first board and a second board, wherein at least one of the boards is a circuitry board. The invention also relates to a system comprising an attachment member and two boards interconnected by said attachment member.

BACKGROUND OF THE INVENTION

It is known to use different kinds of clips to connect electronic components to each other. In U.S. Pat. No. 5,117,330 there is e.g. disclosed a fixture for fixing the position of a circuit component relative to a circuit board. In such clips or fixtures there are typically a number of design considerations that should be addressed. There is e.g. often a desire to reduce the amount of material used in the clip, to reduce the space required by the clip, to facilitate installation, to increase the retaining force once the installation is finished.

In EP 1587349 a board fixing device is disclosed with a connector having spring contacts forming a contact point row in a direction perpendicular to the insertion direction of a board.

In JP 2003163461 a connector is provided for coupling a memory board to a main board. The main board and the memory board have corresponding through holes which are arranged for coupling the two boards via mounting parts.

SUMMARY OF THE INVENTION

It is an object of the present invention to address at least some of the above mentioned design considerations.

According to a first aspect of the invention, this and other objects are achieved by an attachment member for interconnection of a first board and a second board, wherein at least one of the boards is a circuitry board, the attachment member comprising
  a base portion extending along a base plane,
  a first pair of legs extending from the base portion in a first direction, wherein the first pair of legs are configured to resiliently flex along a respective flexing direction away from each other thereby allowing a portion of a first board to be inserted between and to lockingly engage the first legs,
  a second pair of legs extending from the base portion in a second direction, the second direction being opposite the first direction, wherein the second pair of legs are configured to resiliently flex along a respective flexing direction away from each other thereby allowing a portion of a second board to be inserted between and to lockingly engage the second legs, and
  a pair of abutment protrusions, each abutment protrusion extending along said base plane from the base portion or from the first or second legs to form an abutment surface outside respective leg of the second pair of legs and with the abutment surface being configured to abut directly or indirectly the second board on a first surface of the second board, the first surface of the second board facing the base portion of the attachment member.

By designing the attachment member with the base portion and the pair of legs as defined above and with the pair of abutment protrusions there is provided an additional abutment between the second board and the abutment surfaces providing an enhanced self-locking effect. This may be used to provide to allow for easy installation and still provide a strong retaining effect of the final installation of the boards. This may also be used to provide a strong retaining effect with a comparably thin attachment member. Thus, by designing the attachment member as defined above it is possible to take into account at least some of the above mentioned design considerations.

The first pair of legs may be positioned at a first distance from each other and the second pair of legs are positioned at a second distance from each other, wherein the first distance is greater than the second distance. This way the attachment member may be designed such that the abutment protrusions may extend outwardly relative to the second legs and still addressing issue of reduce the space required. It is e.g. possible to design the attachment member such that the projection of the abutment protrusions on the base plane is within the projection of the first legs on the base plane, whereby the presence of the abutment protrusions does not increase the space required.

Each leg of the first pair of legs may be provided with an inner shoulder portion forming a shoulder surface facing in the first direction and positioned at a distance from the base portion and at a distance from the abutment surfaces as seen along the first direction. By providing a shoulder surface like this it is possible to provide a distinct positioning of the first board relative to the base portion and also relative to the second board. The latter may e.g. be of importance if the first board is a driver PCB with high voltage circuitry and the second board is an LED PCB with a low voltage circuitry.

The abutment protrusions may be connected to the base portion or the first or second legs at a junction provided at a distance from the abutment surfaces as seen in the first direction, wherein the abutment protrusions have an extension from said junction along the base plane and also along the second direction thereby forming a gap between the abutment surface and respective leg of the second pair of legs as seen along the base plane. In one embodiment the abutment protrusions extend from respective leg of the first pair of legs. In one embodiment the abutment protrusions extend from respective leg of the second pair of legs. In one embodiment the abutment protrusions extend basically as a continuation of the base portion outwardly along the base plane. By forming a gap between the abutment surface and respective leg of the second pair of legs as seen along the base plane, it is possible to provide significant lever arms in the connection and strengthening between the first surface of the first board and the second legs and still use a minimum amount of material forming the abutment protrusion.

The abutment protrusions may extend along the second direction such that the abutment surfaces are positioned at a distance from the base portion as seen along the second direction. With this design it is easy to provide a gap between the base portion and the second board. This gap may e.g. provide increased flexibility to the second legs by allowing a longer free length of the second legs.

Each leg of the first pair of legs may be provided with an outer shoulder portion forming a shoulder surface facing in the second direction. This outer shoulder portion may e.g. be used to attach other components or enclosures by a snap-lock mechanism engaging the outer side of the first legs and down below the step formed by the outer shoulder portion.

The abutment protrusions may extend outwardly from the base portion. This will provide an advantageous transfer of the forces from the abutment protrusions into the base portion and the second legs will be able to forcefully pull the base portion and in turn force the abutment surfaces in strong abutment directly or indirectly with the first surface of the second board.

The body portion, the first and second pairs of legs and the abutment protrusions may be integrally formed in a polymeric material. This facilitates manufacture of the attachment member. The attachment member may e.g. be integrally formed using injection moulding.

The abutment surfaces may have an extension in a transverse direction being greater than the extension of the second legs in the transverse direction, the transverse direction being transverse to a longitudinal direction, extending in the base plane between the legs of the second pair of legs, and extending along said base plane. This way the abutment surfaces will interact with the first board over a comparably long distance in the transverse direction and thereby will stabilise the attachment member against and unwanted tilting movements in the transverse direction. Any tiling movements in the longitudinal direction is counteracted by the fact that the legs of respective pair of legs are interconnected via the longitudinally extending base portion.

Each of the legs of the first and second pair of legs are provided with a retaining bulge facing the other leg of respective pair of legs. Respective portion of the respective board is allowed to pass between the retaining bulges by the legs being flexibly and resiliently bent away from each other. The retaining bulges will then counteract any unwanted removal of the respective portion of the respective board. The retaining bulges may on its side facing the free ends of the legs have a sloping insertion surface facing inwardly towards the opposing leg and towards the free end of the legs. This way the insertion of a portion of a board between the legs will in itself urge the legs away from each other. The retaining bulges may on the side facing the base portion have a locking surface facing the base portion. The locking surface may have a slight inclination slightly opening up towards the opposing leg. The locking surface engages the respective portion of the board and prevents the board from being moved away from its position between the legs.

The above mentioned and other objects are also achieved by a system comprising an attachment member, a first board retained between the first pair of legs, and a second board retained between the second pair of legs.

The first board may be a driver PCB. The second board may be an LED PCB.

The legs of the second pair of legs may extend through through-going openings in the second board. This way the attachment member may be attached to a board having a greater extension than the attachment member.

An insulation layer may be provided on the first surface of the second board facing the first board and may be in contact with the abutment surfaces of the abutment protrusions. This way an insulation layer may be held in place. Moreover, an insulation layer may be provided without impairing the function of the attachment member.

In short the invention may also be said to relate to an attachment member for interconnection of a first board and a second board, wherein at least one of the boards is a circuitry board, the attachment member comprising: a base portion extending along a base plane, a first pair of legs extending from the base portion in a first direction and being adapted to between them receive a portion of a first board, a second pair of legs extending from the base portion in a second direction and being adapted to between them receive a portion of a second board, and a pair of abutment protrusions, each abutment protrusion extending along said base plane from the base portion or from the first or second legs to form an abutment surface positioned outside respective leg of the second pair of legs and facing in the second direction.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) illustrating the general structures of embodiments of the present invention.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1:
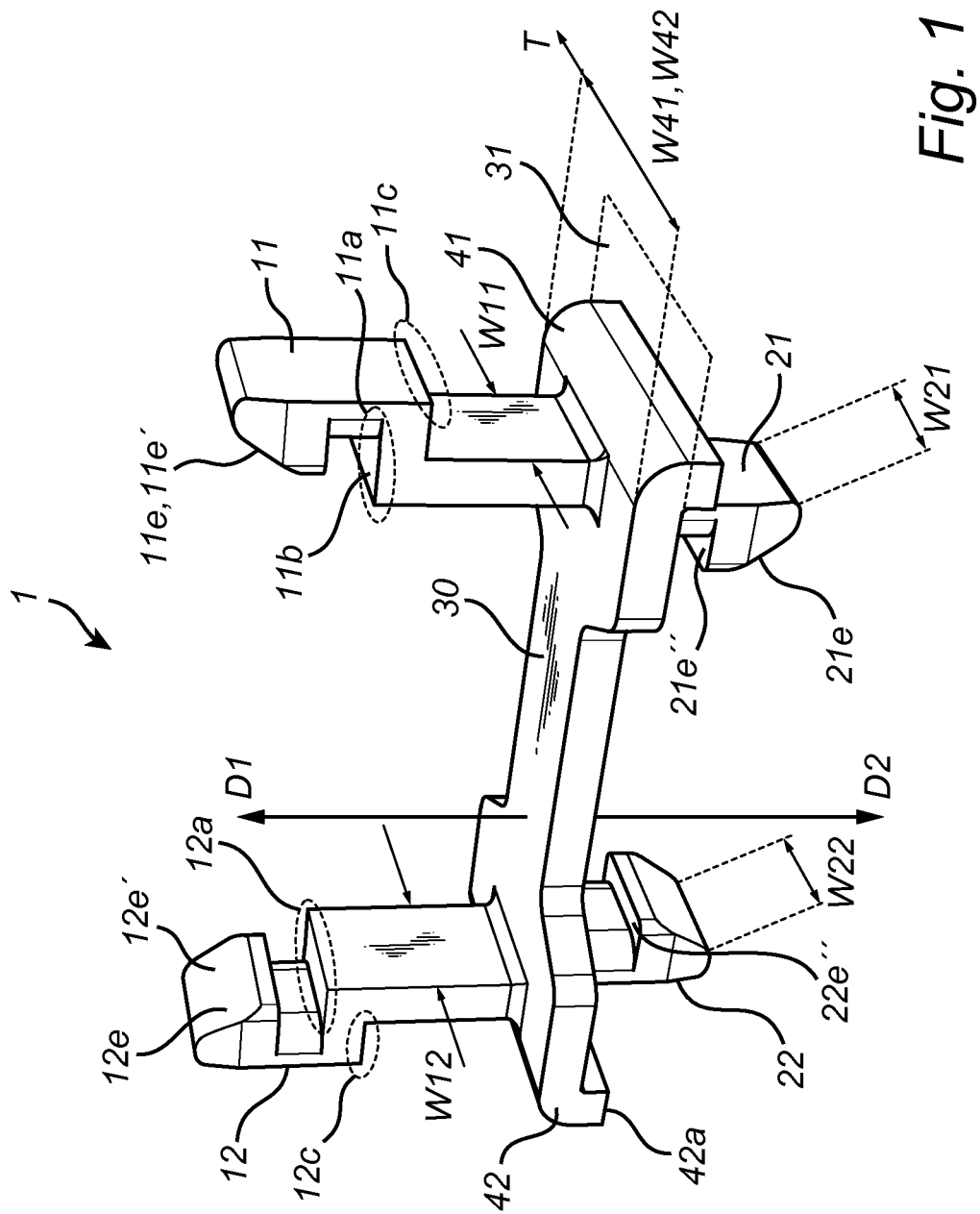
FIG. 1 is a perspective view of an attachment member.
Figure 2:
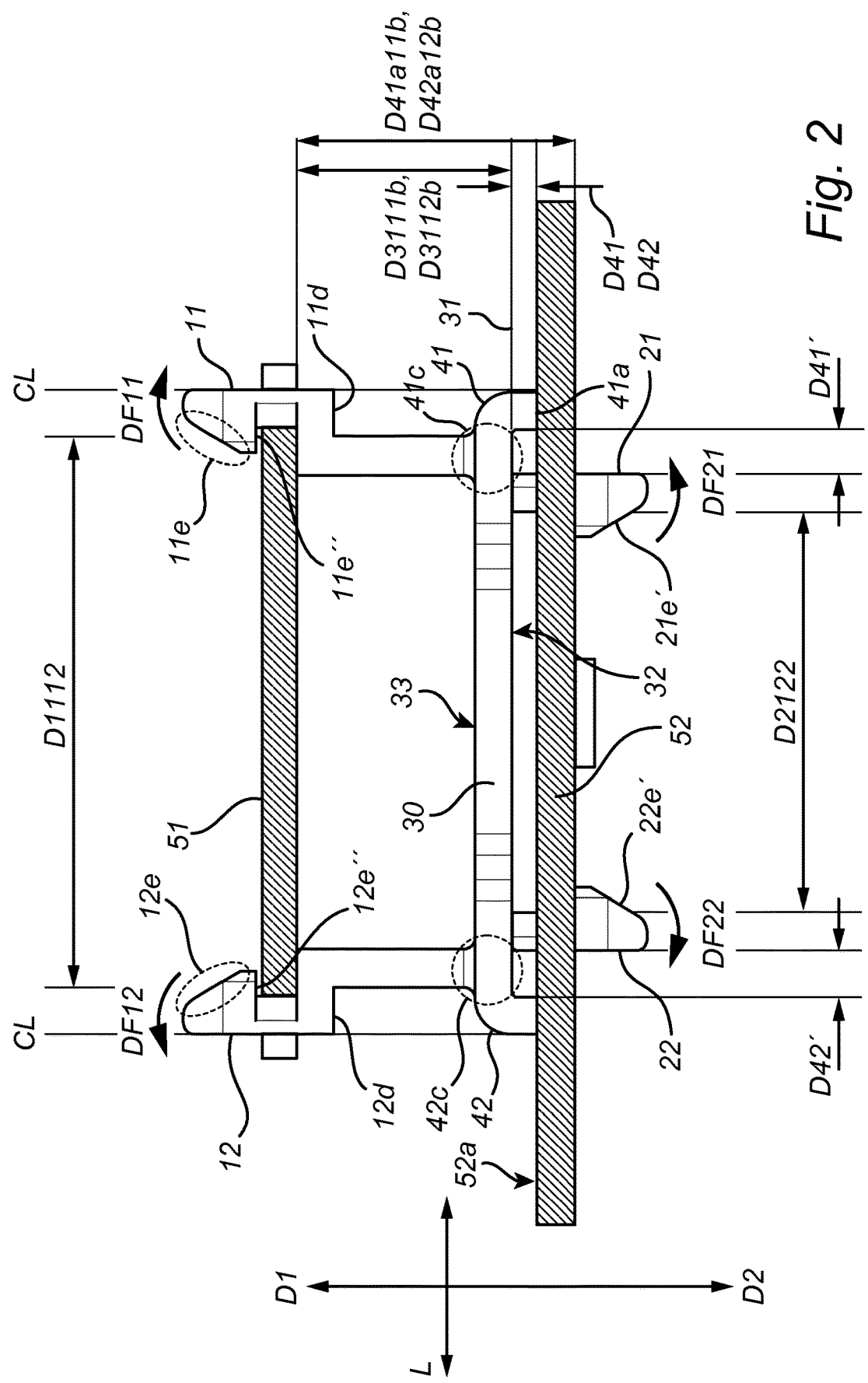
FIG. 2 is a side view of an attachment member and two boards.

The attachment member 1 comprises in general a base portion 30 extending along a base plane 31. The base plane 31 is illustrated in FIG. 1 as coinciding with a first major surface 32 of the base portion 30. The base portion 30 has a second major surface 33 opposite the first major surface 32. The attachment member 1 further comprises a first pair of legs 11, 12 extending from the base portion 30 in a first direction D1 and a second pair of legs 21, 22 extending from the base portion 30 in a second direction D2, the second direction D2 being opposite the first direction D1.

As shown in FIGS. 2-5, the attachment member 1 is adapted for interconnection of a first board 51 and a second board 52.

The first pair of legs 11, 12 are configured to resiliently flex along a respective flexing direction DF11, DF12 away from each other thereby allowing a portion of a first board 51 to be inserted between and to lockingly engage the first legs 11, 12. The second pair of legs 21, 22 are configured to resiliently flex along respective flexing direction DF21, DF22 away from each other thereby allowing a portion of a second board 52 to be inserted between and to lockingly engage the second legs 21, 22. In this preferred embodiment, the flexing directions DF11, DF12, DF21, DF22 will be parallel to the plane of FIG. 2.

The attachment member 1 further comprises a pair of abutment protrusions 41, 42. Each abutment protrusion 41, 42 extends along said base plane 31 from the base portion 30 to form an abutment surface 41a, 42a outside respective leg 21, 22 of the second pair of legs 21, 22. The abutment surfaces 41a, 42a are configured to abut directly or indirectly the second board 52 on a first surface 52a of the second board 52, the first surface 52a of the second board 52 facing the base portion 30 of the attachment member 1. It may be noted that the abutment surfaces 41a, 42a may abut the first surface 52a directly. It may be noted that the abutment may be indirect, such as when an insulation layer 52a' is positioned between the first surface 52a and the abutment surfaces 41a, 42a.

The first pair of legs 11, 12 are positioned at a first distance D1112 from each other. The second pair of legs 21, 22 are positioned at a second distance D2122 from each other. The first distance D1112 is greater than the second distance D2122. It may be noted that abutment protrusions 41, 42 extend outwardly relative to the second legs 21, 22 and still is within the projection CL of the first legs 11, 12 on the base plane 31.

Each leg 11, 12 of the first pair of legs is provided with an inner shoulder portion 11a, 12a forming a shoulder surface 11b, 12b facing in the first direction D1 and positioned at a distance D3111b, D3112b from the base portion 30 and at a distance D41a11b, D42a12b from the abutment surfaces 41a, 42a as seen along the first direction D1. By providing a shoulder surface 11b, 12b like this it is possible to provide a distinct positioning of the first board 51 relative to the base portion 30 and also relative to the second board 52. The latter may e.g. be of importance if the first board 51 is a driver PCB (printed circuit board) with high voltage circuitry 51' and the second board 52 is an LED PCB (light emitting diode printed circuit board) with a low voltage circuitry. This is e.g. shown in FIG. 5, with the second board 52 supporting a plurality of LEDs 52' (light emitting diodes). The abutment protrusions 41, 42 are in the preferred embodiment connected to the base portion 30 at a junction 41c, 42c provided at a distance D41, D42 from the abutment surfaces 41a, 42a as seen in the first direction D1. The abutment protrusions 41, 42 have an extension from said junction 41c, 42c along the base plane 31 and also along the second direction D2 thereby forming a gap D41', D42' between the abutment surface 41a, 42a and respective leg of the second pair of legs 21, 22 as seen along the base plane 31. In the disclosed embodiment, the abutment protrusions 41, 42 have an initial extension along the base plane 31 and then turns to have an extension along the second direction D2. In an alternative embodiment, the abutment protrusions extend along a sloped line having extension both along the base plane 31 and the second direction D2. Alternatively, the abutment protrusions 41, 42 may be a combination of the above embodiments, such as having an initial portion along the base plane 31, a sloping central portion and an end portion extending in the second direction D2. Alternatively, one or more of these initial, central or end portions may also be omitted.

The abutment protrusions 41, 42 may extend along the second direction D2 such that the abutment surfaces 41a, 42a are positioned at a distance D41, D42 from the base portion 30 as seen along the second direction D2, thereby providing a gap D41, D42 between the base portion 30 and the second board 52.

Figure 3A:
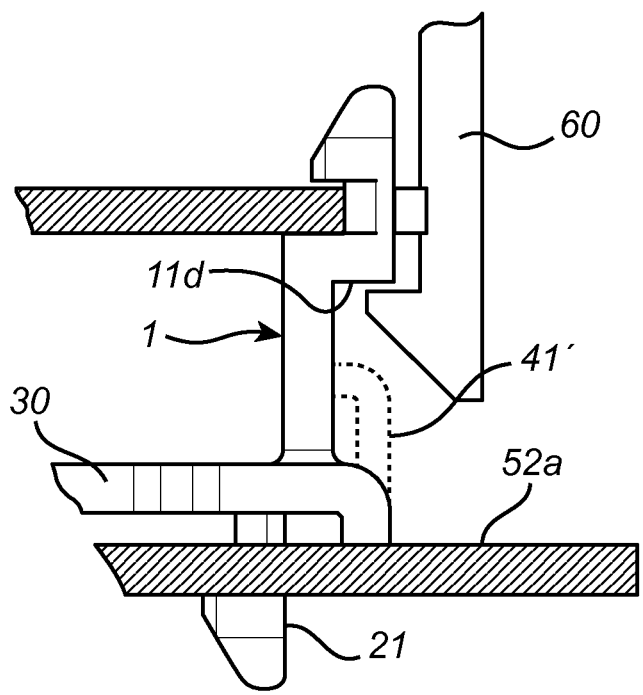
FIG. 3a is a partial enlargement of FIG. 2 indicating attachment of a further member.
Figure 3B:
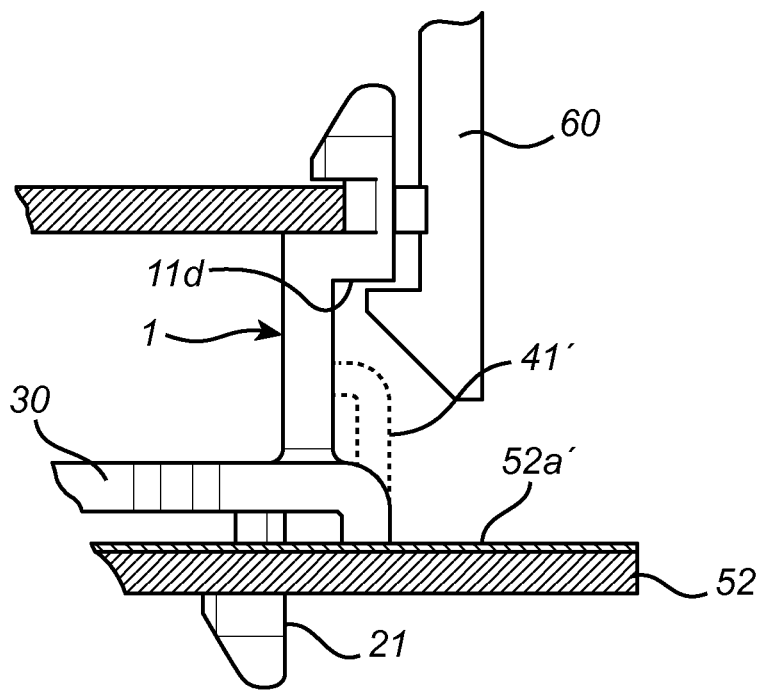
FIG. 3b is a view corresponding to FIG. 3a in which there is disclosed in insolation
Figure 4:
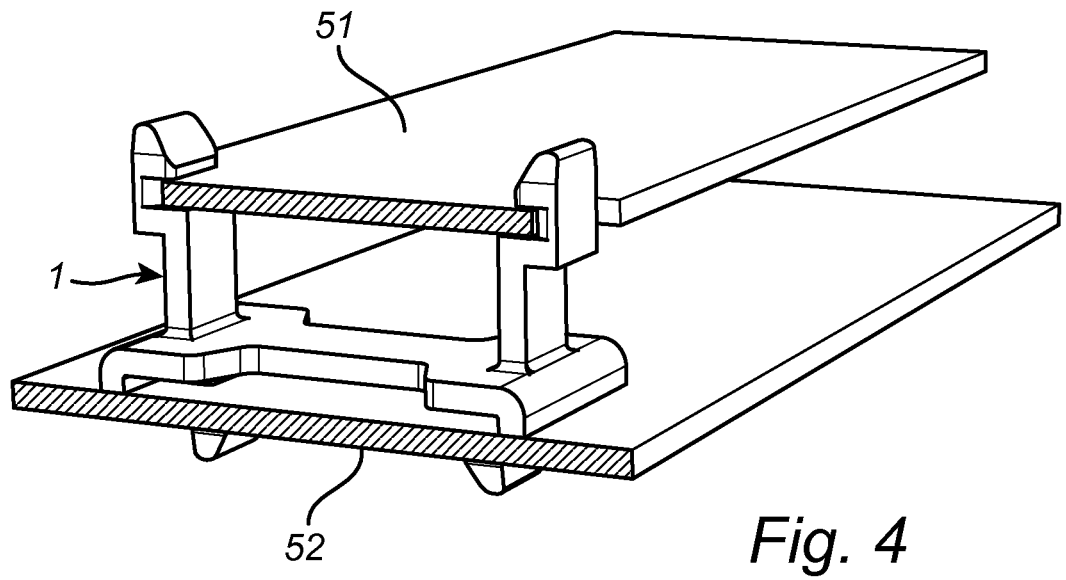
FIG. 4 is a perspective view corresponding to FIG. 2.
Figure 5:
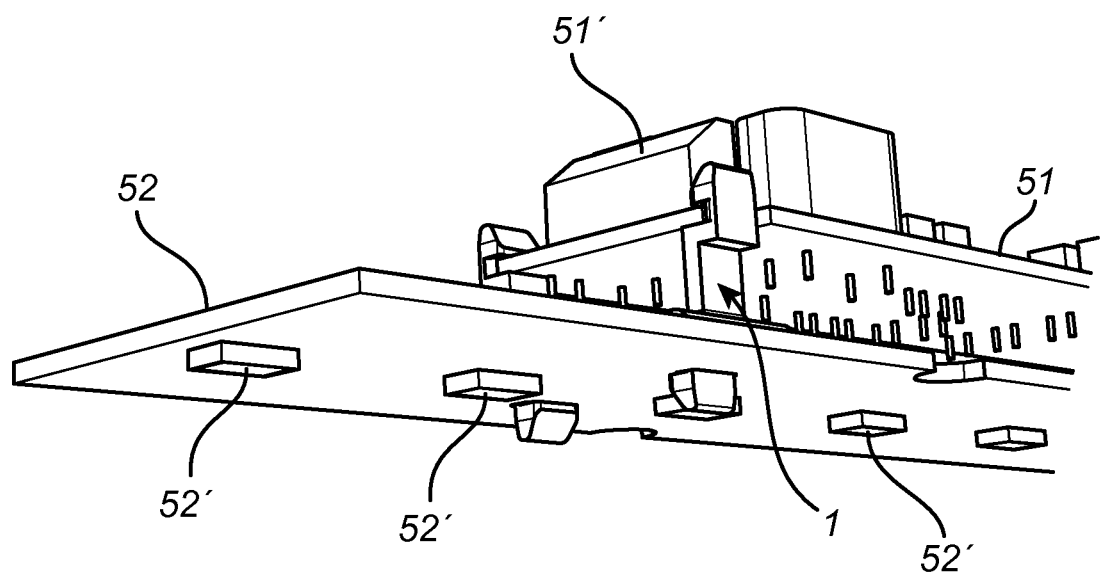
FIG. 5 is a perspective view showing an attachment member between a driver PCB and an LED PCB.

Each leg 11, 12 of the first pair of legs is provided with an outer shoulder portion 11c, 12c forming a shoulder surface 11d, 12d facing in the second direction D2. This outer shoulder portion may e.g. be used to attach other components or enclosures 60 by a snap-lock mechanism engaging the outer side of the first legs 11, 12 and down below the step formed by the outer shoulder portion 11c, 12c as shown in FIGS. 3a and 3b.

In the preferred embodiment the attachment member 1 with its body portion 30, the first and second pairs of legs 11,12, 21, 22 and the abutment protrusions 41, 42 is integrally formed in a polymeric material. The material may e.g. have a 5 VA flame ability rating. The attachment member 1 may e.g. be integrally formed using injection moulding.

The abutment surfaces 41, 42 have an extension, a width W41, W42, in a transverse direction T being greater than the extension, the width W21, W22 of the second legs 21, 22 in the transverse direction T. The transverse direction T being transverse to a longitudinal direction L extending in the base plane 31 between the legs 21, 22 of the second pair of legs and extending along the base plane 31.

Each of the legs 11, 12, 21, 22 of the first and second pair of legs are provided with a retaining bulge 11e, 12e, 21e, 22e facing the other leg of respective pair of legs. Respective portion of the respective board 51, 52 is allowed to pass between the retaining bulges 11e, 12e, 21e, 22e by the legs 11, 12, 21, 22 being flexibly and resiliently bent away from each other. The retaining bulges 11e, 12e, 21e, 22e will then counteract any unwanted removal of the respective portion of the respective board 51, 52. The retaining bulges 11e, 12e, 21e, 22e have on its side facing the free ends of the legs a sloping insertion surface 11e', 12e', 21e', 22e' facing inwardly towards the opposing leg and towards the free end of the legs. This way the insertion of a portion of a board 51, 52 between the legs 11, 12, 21, 22 will in itself urge the legs 11, 12, 21, 22 away from each other. The retaining bulges 11e, 12e, 21e, 22e have on the side facing the base portion 30 a locking surface 11e", 12e", 21e", 22e" facing the base portion 30. In the preferred embodiment, the locking surfaces 11e", 12e", 21e", 22e" are parallel to the base plane 31. The locking surfaces 11e", 12e", 21e", 22e" engages the respective portion of the respective board 51, 52 and prevent the board 51, 52 from being moved away from its position between the legs 11, 12, 21, 22.

As a system it may be said to comprise an attachment member 1, a first board 51 retained between the first pair of legs 11, 12, and a second board 52 retained between the second pair of legs 21, 22.

It may be noted that the legs 11, 12, 21, 22 may abut outer edges of the respective board 51, 52 or extend through through-going openings in the respective board 51, 52. In one embodiment, the legs 21, 22 of the second pair of legs extend through through-going openings in the second board 52.

An insulation layer 52a' may be provided on the first surface 52a of the second board 52 facing the first board 51. This insulation layer 52a' may be in contact with the abutment surfaces 41a, 42a of the abutment protrusions 41, 42. This way an insulation layer 52a' may be held in place. Moreover, the insulation layer 52a' may be provided without impairing the function of the attachment member 1.

The person skilled in the art realizes that the present invention by no means is limited to the preferred embodiments described above. On the contrary, many modifications and variations are possible within the scope of the appended claims. For example, each abutment protrusion may extend along said base plane 31 from the first legs 11, 12 as indicated by the dashed lines with reference numeral 41' in FIGS. 3a and 3b. Alternatively, each abutment protrusion 41, 42 may extend along said base plane 31 from the second legs 21, 22. In such an embodiment the base portion 30 is preferably positioned at a greater height (moved along direction D1 in e.g. FIG. 1) compared to the shown embodiment, thereby providing a greater free length of the second legs 21, 22 between the base portion 30 and the first surface 52a of the second board 52.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. It may be noted that the label inner in this particular case may be regarded as a side of a leg facing the other leg of the same pair of legs. The label outer is regarded as a side of a leg facing away from the other leg of the same pair of legs. Any reference to the labels upper and lower refer to the orientation of the drawings, the attachment member may be oriented in any orientation when in use.

The invention claimed is:

1. Attachment member for interconnection of a first board and a second board, wherein at least one of the boards is a circuitry board, the attachment member comprising:
    a base portion extending along a base plane,
    a first pair of legs extending from the base portion in a first direction (D1), wherein the first pair of legs are configured to resiliently flex along a respective flexing direction (DF11, DF12) away from each other thereby allowing a portion of a first board to be inserted between and to lockingly engage the first legs, and to thereby define a center region of the attachment member situated between the first pair of lees,
    a second pair of legs extending from the base portion in a second direction (D2), the second direction (D2) being opposite the first direction (D1), wherein the second pair of legs are configured to resiliently flex along a respective flexing direction (DF21, DF22) away from each other thereby allowing a portion of a second board to be inserted between and to lockingly engage the second legs,
    a pair of abutment protrusions, each abutment protrusion extending along said base plane from the base portion or from the first or second legs to form an abutment surface external to the center region and with the abutment surface being configured to abut directly or indirectly the second board on a first surface of the second board, the first surface of the second board facing the base portion of the attachment member, and
    wherein each leg of the first pair of legs is provided with an outer shoulder portion external to the center region and forming a shoulder surface facing in the second direction (D2).

2. Attachment member according to claim 1, wherein the first pair of legs are positioned at a first distance (D1112) from each other and the second pair of legs are positioned at a second distance (D2122) from each other, wherein the first distance (D1112) is greater than the second distance (D2122).

3. Attachment member according to claim 1, wherein each leg of the first pair of legs is provided with an inner shoulder portion forming a shoulder surface facing in the first direction (D1) and positioned at a distance (D3111b, D3112b) from the base portion and at a distance (D41a11b, D42a12b) from the abutment surfaces as seen along the first direction (D1).

4. Attachment member according to claim 1, wherein the abutment protrusions are connected to the base portion or the first or second legs at a junction provided at a distance (D41, D42) from the abutment surfaces as seen in the first direction (D1), wherein the abutment protrusions have an extension from said junction along the base plane and also along the second direction (D2) thereby forming a gap (D41', D42') between the abutment surface and respective leg of the second pair of legs as seen along the base plane.

5. Attachment member according to claim 1, wherein the abutment protrusions extend along the second direction (D2) such that the abutment surfaces are positioned at a distance (D41, D42) from the base portion as seen along the second direction (D2).

6. Attachment member according to claim 1, wherein the abutment protrusions extend outwardly from the base portion.

7. Attachment member according to claim 1, wherein the body portion, the first and second pairs of legs and the abutment protrusions are integrally formed in a polymeric material.

8. Attachment member according to claim 1, wherein the abutment surfaces have an extension (W41, W42) in a transverse direction (T) being greater than the extension (W21, W22) of the second legs in the transverse direction (T), the transverse direction (T) being transverse to a longitudinal direction (L), extending in the base plane between the legs of the second pair of legs, and extending along said base plane.

9. Attachment member according to claim 1, wherein each of the legs of the first and second pair of legs are provided with a retaining bulge facing the other leg of respective pair of legs.

10. System comprising:
    an attachment member according to claim 1,
    a first board retained between the first pair of legs, and
    a second board retained between the second pair of legs.

11. System according to claim 10, wherein the first board is a driver PCB and the second board is an LED PCB.

12. System according to claim 10, wherein the legs of the second pair of legs extend through through-going openings in the second board.

13. System according to claim 10, wherein an insulation layer is provided on the first surface of the second board facing the first board and being in contact with the abutment surfaces of the abutment protrusions.

* * * * *